Oct. 16, 1962 H. L. CASWELL ET AL 3,058,852

METHOD OF FORMING SUPERCONDUCTIVE CIRCUITS

Filed March 30, 1960

INVENTORS
HOLLIS L. CASWELL
CHARLES CHIOU

BY [signature]

ATTORNEY

United States Patent Office 3,058,852
Patented Oct. 16, 1962

3,058,852

METHOD OF FORMING SUPERCONDUCTIVE CIRCUITS

Hollis L. Caswell and Charles Chiou, Poughkeepsie, N.Y., assignors to International Business Machines Corporation, New York, N.Y., a corporation of New York Filed Mar. 30, 1960, Ser. No. 18,647
7 Claims. (Cl. 117—212)

This invention relates to a method of forming superconductive circuits and more particularly to an improved method of eliminating the edge thickness gradient of evaporated thin films.

A specific flow diagram of the invention is as follows:

| |
|---|
| Place evaporant charge in an evaporant source structure positioned within a vacuum chamber |
| ↓ |
| Position a substrate and a pattern mask in alignment with the evaporant source structure |
| ↓ |
| Evacuate the chamber to the evaporation pressure |
| ↓ |
| Subject the substrate to a high temperature bake out to desorb impurities therefrom (optional) |
| ↓ |
| Evaporate charge to obtain desired thin film geometry configuration |
| ↓ |
| Subject the deposited film to a temperature near the melting temperature of the charge material for several minutes until the edges of the deposit are electrically disassociated from the central portions thereof |

The phenomenon of superconductivity, that is, the ability of certain materials to exhibit zero resistance to the flow of an electrical current when cooled to a sufficiently low temperature is employed in the design of various electrical circuits such as, by way of example, amplifiers, oscillators, and logical circuits. In general each of these superconductive circuits employ a cryotron device. The cryotron may briefly be described as including a gate conductor, the conduction state of which, either superconducting or normal, is controlled by a control conductor. In an article by D. A. Buck which appeared in the Proceedings of the IRE, vol. 44, No. 4, April 1956, at pages 482 through 493, the cryotron is there described as consisting of a central cylindrical wire cooled to a superconductive temperature which functions as the gate conductor. Associated with the gate conductor is a single layer coil, generally fabricated of superconductive material, which functions as the control conductor. Current flow of at least a predetermined value through the control conductor generates a magnetic field which is effective to destroy superconductivity in the gate conductor, which then exhibits normal electrical resistance to current flow therethrough. In this manner, the cryotron provides a low cost, low power consuming, reliable circuit element.

In general, dynamic operation of superconductive circuits requires that a current flowing through one or more gate conductors be shifted, either partially or completely, through one or more other gate and/or control conductors. It has been shown in the above referenced article, that the time constant of this current shift is directly proportional to the circuit inductance and inversely proportional to the circuit resistance. Because of the relatively high inductance and low resistance exhibited by wire wound cryotrons, they are inherently a slow speed device.

Copending application Serial No. 625,512, filed November 30, 1956, on behalf of Richard L. Garwin and assigned to the assignee of this invention, discloses an improved cryotron type device which, while maintaining each of the advantages of wire wound cryotrons, additionally permits high speed operation. These cryotron type devices are fabricated of thin films of superconductive material, a first thin film functions as the gate conductor and a second thin film, insulated from the first, functions as the control conductor. High speed operation of these thin film cryotrons as compared to wire wound cryotrons, is possible since the circuit inductance can be reduced by several orders of magnitude, and, simultaneously, the circuit resistance can be increased by several orders of magnitude, if desired.

The film thickness of these thin film cryotrons is generally only about several thousand Angstrom units and for this reason superconductive circuits, either simple or complex, may advantageously be fabricated in quantity by the evaporation of the necessary materials onto a substrate within an evacuated chamber. Vacuum deposition of materials has been employed in fabrication of a large number of articles, and a summary of the various techniques involved is contained in "Vaccum Deposition of Thin Films," by L. Holland, published 1958 by John Wiley and Sons, Inc., New York.

It has been found, however, that it is difficult to fabricate thin film superconductive circuits economically in quantity for the reason that the characteristics of thin film cryotrons, and more particularly the characteristics of thin film gate conductors, are generally not controllable and reproducible from cryotron to cryotron. This results primarily from the fact that thin film gate conductors do not always exhibit an abrupt and predetermined transition between the superconducting and resistive conduction state as a function of either the operating temperature or applied magnetic field.

In U.S. Patent 2,989,716, filed December 21, 1959, on behalf of Andrew E. Brennemann et al., and assigned to the assignee of this invention, there is disclosed a novel method of obtaining thin film gate conductors having controllable and reproducible characteristics with regard to the transition between conduction states which are fabricated by vacuum deposition. Briefly the invention as disclosed in the above referenced copending application includes the steps of vacuum depositing a superconductive material onto a substrate wherein the area of deposition is determined by a pattern defining mask, then severing a portion of the edges of the deposit. Thin film gate conductors fabricated by the above method are characterized by a relatively sharp and controllable transition between conduction states, independent of whether or not a sharp transition was exhibited prior to the severing of the edges.

What has been discovered, as will be more particularly described in detail hereinafter, is an improved method of forming thin film cryotrons which is also effective to disassociate the edges of deposited films, to thereby obtain relatively sharp and reproducible transitions between conduction states. Further, the method according to the invention is additionally effective to impart long term stability to the transition characteristics of the thin film cryotrons. A first embodiment of the invention comprises subjecting a thin film of superconductive material to a temperature just below the melting temperature of the superconductive material for a short time interval of several minutes. This results in the edges of the film being thereafter electrically discontinuous from the major portion of the deposited film, the film then exhibiting transition characteristics approaching that of the bulk material. A second embodiment of the invention includes the step of subjecting the substrate, upon which the thin film is later deposited, to a high temperature bake out, thereafter cooling the substrate to room temperature prior to deposition.

It is an object of the invention, therefore, to provide an improved method of fabricating superconductive circuits.

Another object of the invention is to provide an improved method of fabricating thin film superconductive gate conductors.

A further object of the invention is to provide a method of stabilizing the characteristics of thin film cryotrons.

Still another object of the invention is to provide an improved method of fabricating thin film cryotrons having controllable and predetermined transition characteristics.

Yet another object of the invention is to provide an improved method of removing the edges of vacuum deposited thin film superconductive gate conductors.

A still further object of the invention is to provide an improved method of fabricating thin film superconductive gate conductors which exhibit relatively sharp and stabilized transitions between conduction states.

The foregoing and other objects, features and advantages of the invention will be apparent from the following more particular description of preferred embodiments of the invention, as illustrated in the accompanying drawings.

Figure 1:
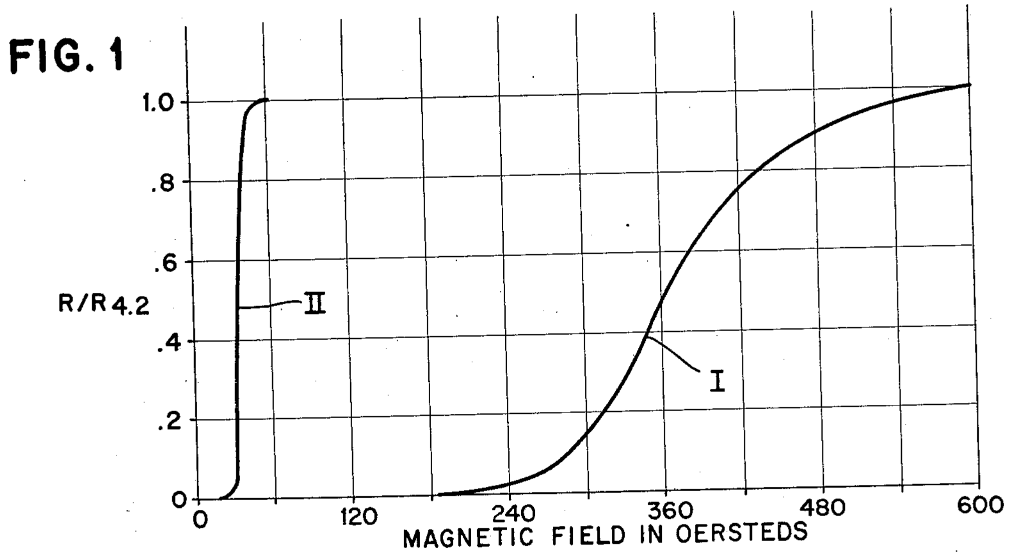
FIG. 1 illustrates the magnetic transitions of thin film superconductive gate conductors.

Referring now to the drawings, curve I of FIG. 1 represents a typical transition curve of a thin film gate conductor fabricated by the vacuum deposition of a superconductive material through a pattern defining mask onto a substrate. More particularly, curve I was obtained from a tin gate conductor of about 3000 Angstrom units in thickness at an operating temperature of 3.73° K. As there shown, resistance begins to appear at an applied magnetic field of about 190 oersteds, and complete resistance is exhibited only when the applied field exceeds 590 oersteds. Because of this large increase in the magnetic field required to switch a vacuum deposited gate conductor completely between conduction states, cryotrons employing these gate conductors do not generally exhibit the expected high speed operation. Further, curve I of FIG. 1 represents only the transition characteristic of a single gate conductor. Other gate conductors fabricated under apparently similar conditions exhibit a wide range of transition characteristics. Referring now to curve II of FIG. 1, there is shown the transition characteristic of the gate conductor which yielded curve I of FIG. 1, as modified by the method of the invention. As there shown, an increase in the applied magnetic field of about 10 oersteds is sufficient to switch the gate conductor between the super-conducting and resistive conduction states.

Figure 2:
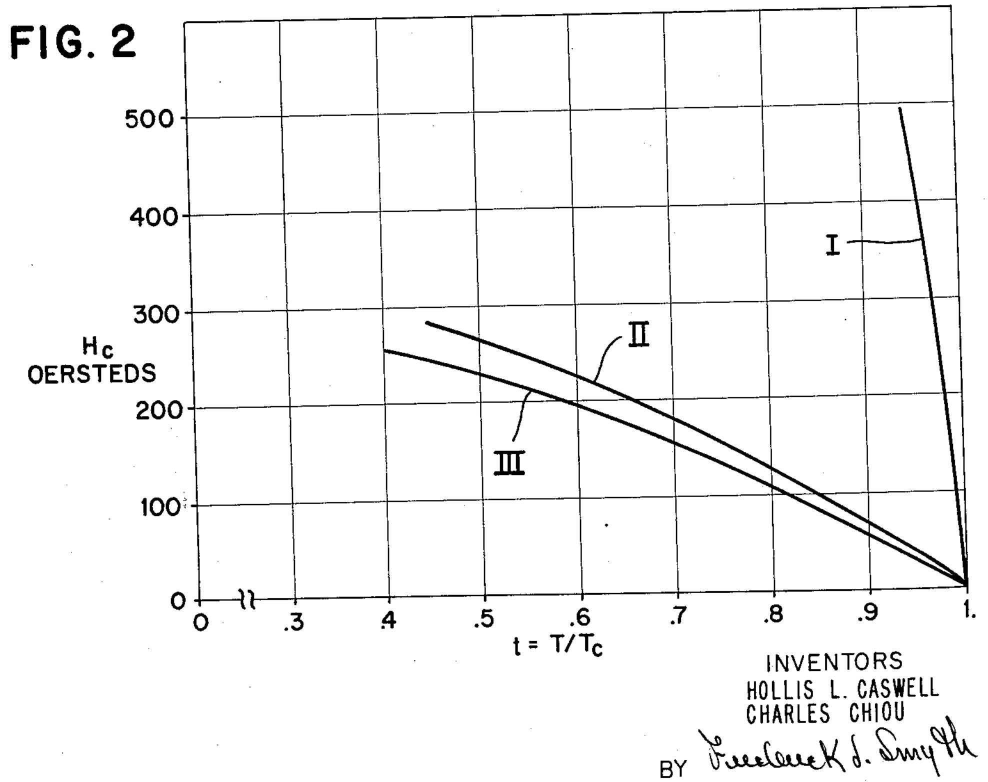
FIG. 2 illustrates the critical magnetic field of thin film superconducting gate conductors as a function of the operating temperature.

The improved transition characteristic afforded by the method of the invention is further illustrated in FIG. 2 wherein there is indicated, as a function of operating temperature, the value of critical field Hc, that is, the magnitude of magnetic field which when applied to the gate conductor, restores one-half the normal resistance therein. Curve I of FIG. 2 shows the results obtained from a typical vacuum deposited thin film gate conductor and curve II of FIG. 2 shows the curve obtained after the thin film gate conductor has been modified in accordance with the method of the invention. By way of reference, curve III of FIG. 2 illustrates the results obtained from a bulk specimen of the superconductive material. Referring again to curves I and III of FIG. 2, it is noticed that the temperature variation of Hc differs markedly from that of the bulk material. As modified by the method of the invention, however, the thin film gate conductor of the invention exhibits a temperature variation of Hc which closely approaches that of the bulk super-conductive metal, as shown by comparison of curve II with curve III, the spread between curves II and III being about that predicated from superconductivity theory, wherein Hc increases as the thickness of thin films decrease.

Before continuing with a further analysis of the results afforded by the invention, the method is next described in detail. Although a number of materials exhibit superconductivity at a sufficiently low temperature, gate conductors are generally fabricated of a material having a lower critical temperature than the material of which the associated control conductors are fabricated, so that the control conductors remain superconducting in the presence of magnetic fields which destroy superconductivity in the gate conductors. By way of example, tin gate conductors have been controlled by lead control conductors, tantalum gate conductors by niobium control conductors, etc. In the following discussion of the method of the invention, tin will be employed as the gate conductor material solely by way of illustration, it being understood that the method is applicable to superconductive materials in general. Metallic tin is first evaporated from a tantalum crucible mounted within an evacuated chamber through a pattern mask which defines the geometric configuration of the gate conductor, onto a glass substrate. The evaporation of the tin is continued, in a vacuum of the order of $10^{-6}$ mm. Hg, until the deposited tin attains a thickness of about 3000 Angstrom units. Since the apparatus required for vacuum deposition of thin films forms no part of the method of the invention, it has neither been shown nor described, it being understood by those skilled in the art that any of these commercially available may be employed. Further, an apparatus particularly adapted to fabricate thin superconductive films during a single evaporation of the vacuum chamber is shown in U.S. Patent 3,023,727, filed September 10, 1959, on behalf of N. Theodoseau et al., and assigned to the assignee of this invention.

The next step in the method is to subject the deposited thin film gate conductor to a temperature slightly below the temperature at which the superconductive material becomes liquid. Bulk tin has a melting point of about 232 degrees centigrade and, continuing with tin as the illustrative example, it is preferred to heat the tin thin film gate conductor to a temperature of about 190 degrees centigrade and maintain this temperature for a period of one and one-half minutes. Slightly lower temperatures may be employed with a corresponding increase in the time the heating temperature is required to be maintained. However, in general, it has been found advantageous to limit this heating time of the thin film in order to prevent the selective absorbtion of residual gas molecules. It will be noted that 190 degrees centigrade defines a temperature of about 80% of the melting temperature of tin, and it has been found that this percentage is additionally effective for superconductive materials other than tin.

This momentary heating of the deposited thin film is effective to cause the edges of the film to become disassociated from the remaining portion of the film, and further to form individual separate islands of material which are electrically separated one from another, and most important, to be electrically separate from the remaining portion of the film. This disassociation occurs because the thinner edges of the deposited film melt at a slightly lower temperature than the thicker center portion. This lower melting temperature appears to result from the tendency of the thinner portions of the film to minimize the surface energy, a large reduction therein being obtained through the formation of spherical globules. The extreme end portions of the edges, being a few atomic layers in thickness, do not necessarily exhibit this tendency due to their surface adhesion to the substrate. Upon cooling the globules solidify in the form of separate islands isolated from the center portion. In this manner, the individual transition characteristics of the separated islands no longer affect the transition characteristic of the remaining center portion. As is described in the hereinbefore referenced U.S. Patent No. 2,989,716, severing the edges of a thin film gate conductor, formed by the thermal evaporation of superconductive material through a pattern defining mask onto a substrate, is effective to attain relatively abrupt transitions between conduction states, the transition characteristics being thereafter determined by the transition characteristics of the uniform center portion of the deposited film. The method of the present invention, which is also effective to disassociate the edge portions from the center portion of the deposited thin film is also effective to improve the transition characteristics as shown in FIGS. 1 and 2. Further, the heating step of the method of this invention is additionally effective to stabilize the transition characteristic of the deposited thin film as a function of time.

It should now be pointed out that if the thin film deposited onto a substrate by means of the thermal evaporation in a vacuum, of the superconductive material through a pattern defining mask is subjected to an elevated temperature for an extended period of time, the transition characteristics, although stabilized as a function of time are, in general, not sufficiently corrected or reproducible for use in high speed switching circuits, and, further, the transition characteristics are dependent on the magnitude of the current conducted by the gate conductor at the time the switching magnetic field is applied thereto. This appears to result from the fact that during the time interval, residual gas molecules are absorbed by the film, both from the residual gas molecules in the vacuum chamber and impurities previously absorbed by the glass substrate.

Referring again now to curve I of FIG. 1, the broad magnetic transition, as there shown, is due to variations in the thickness of the edges of the deposited film, resulting in various portions of the edges having different critical field values. Since measurements of the magnetic field transitions are generally made with a small value of current flowing through the gate conductor, the center portion of thin film can be resistive without a voltage developing across the end terminals thereof. This occurs because the gate current flowing through the superconducting edge portions of the film does not attain a sufficient density to, by itself, drive the edges resistive. That this occurs, is shown by curve I of FIG. 1, where intense magnetic fields are required to completely drive the thinner edge portions of the thin film, resistive. However, with the edges dissociated from the center portion in accordance with the method of the invention, an abrupt transition, characteristic of pure superconductive metals is obtained as shown by curve II of FIG. 1.

Another embodiment of the invention includes the further steps of subjecting the substrate to a high temperature vacuum bake out and then cooling the substrate to room temperature prior to the evaporation of the superconductive material. These steps are effective to reduce the amount of impurities that diffuse into the deposited film, from the substrate itself, which include water vapor and other absorbed gases.

Additionally, these steps allow the heating step to be performed at a lower temperature and/or for a shorter time interval, since the fewer impurities present on the substrate surface reduces the surface adhesion of the edge portions of the deposited film.

While the invention has been particularly shown and described with reference to preferred embodiments thereof, it will be understood by those skilled in the art that various changes in form and details may be made therein without departing from the spirit and scope of the invention.

What is claimed is:

1. The method of fabricating a thin film gate conductor having a relatively abrupt magnetic transition between the superconducting and resistive conduction states comprising the steps of forming a thin film of superconductive material upon an outgassed substrate within an evacuated chamber by thermally evaporating said superconductive material through a pattern defining mask; said thin film thereby including a center portion and a pair of edge portions; and subjecting said thin film to an elevated temperature below the melting temperature of said center portion for a time sufficient only to electrically disassociate said pair of edge portions from said center portion, said time being insufficient to allow impurities to be absorbed by said center portion.

2. The method of fabricating a thin film gate conductor having a relatively abrupt magnetic transition between the superconducting and resistive conduction states comprising the steps of: vacuum depositing a superconductive material through a mask upon a substrate in a predetermined pattern; subjecting said deposited material to a temperature slightly below the melting temperature of said superconductive material for several minutes, until the edges of said pattern are electrically disassociated from the remaining portion of said pattern.

3. The method of claim 2 wherein said superconductive material is tin.

4. The method of forming thin film gate conductors having relatively sharp and reproducible transitions between conduction states comprising the steps of depositing a thin film of superconductive material through a pattern mask onto a substrate within an evacuated chamber; said thin film thereby including a center portion having a relatively uniform composition and a pair of edge portions having a relatively non-uniform composition; subjecting said thin film to a temperature of about 80% of the melting temperature of said superconductive material for a time interval of several minutes; said pair of edge portions being thereby electrically discontinuous from said center portion and said thin film exhibiting a stabilized transition characteristic approaching that of the bulk superconductive material.

5. The method of forming a thin film superconductive circuit element operable at a superconductive temperature, said element exhibiting relatively sharp and reproducible transitions between the superconducting and resistive conduction states at said superconductive temperature, which method comprises the steps of depositing a thin film of superconductive material through a pattern mask onto a substrate within an evacuated chamber; said thin film thereby having a center portion of relatively uniform thickness and a pair of lateral edge portions each having a thickness essentially equal to the thickness of said center portion throughout the region where said edge portions are contiguous with said center portion, the thickness of said edge portions decreasing as the distance from said center portion increases; and momentarily heating said deposited thin film to a temperature about 20% less than the melting temperature of said superconductive material for a limited time; said temperature and time combining only to convert said lateral edge portions into separate islands of superconductive material which are both electrically separated one from another and electrically separate from the center portion of said deposited thin film.

6. The method of forming a thin film superconductive component operable at a superconductive temperature, said thin film component exhibiting essentially abrupt transitions between the superconducting and resistive states equivalent to the transitions exhibited by bulk superconductive material, which method comprises the steps of thermally evaporating said superconductive material within an evacuated chamber and directing said evaporated material through a pattern mask which defines the geometry of said component onto a substrate; said geometric pattern thereby including a center portion of uniform thickness and a pair of lateral edge portions of varying thickness as determined by said mask; and electrically disassociating said edge portions from said center portion by subjecting said deposited film momentarily to an elevated temperature sufficient only to allow the surface energy of said edge portions to be minimized through the formation of spherical globules, said globules thereafter solidifying into separate islands isolated from said center portion.

7. The method of fabricating a thin film gate conductor having a relatively abrupt magnetic transition between superconducting and resistive states comprising the steps of forming a thin film of superconductive material upon a substrate within an evacuated chamber by thermally evaporating said superconductive material through a mask which defines the geometry of said gate conductor, said thin film thereby including a center portion and a pair of edge portions, said edge portions having different thermal characteristics from said center portion, and subjecting said thin film gate to an elevated temperature below the melting temperature of said center portion and sufficient to disassociate said edge portions into a large number of independent globules.

References Cited in the file of this patent

UNITED STATES PATENTS

| | | |
|---|---|---|
| 2,849,583 | Pritikin | Aug. 26, 1958 |
| 2,930,106 | Wrotnowski | Mar. 29, 1960 |
| 2,936,435 | Buck | May 10, 1960 |

OTHER REFERENCES

Buck: "Proc. of the IRE," April 1956, pages 482–493, page 486 relied on.

Holland: "Vacuum Deposition of Thin Films," 1956, John Wiley and Sons, N.Y., page 215 relied on.